(12) United States Patent
Won et al.

(10) Patent No.: US 7,612,399 B2
(45) Date of Patent: Nov. 3, 2009

(54) SEMICONDUCTOR INTEGRATED CIRCUIT DEVICES

(75) Inventors: Seok-Jun Won, Gyeonggi-do (KR); Min-Woo Song, Gyeonggi-do (KR); Weon-Hong Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 184 days.

(21) Appl. No.: 11/593,408

(22) Filed: Nov. 6, 2006

(65) Prior Publication Data

US 2007/0102746 A1 May 10, 2007

(30) Foreign Application Priority Data

Nov. 8, 2005 (KR) ........................ 10-2005-0106710
Nov. 15, 2005 (KR) ........................ 10-2005-0109276

(51) Int. Cl.
*H01L 27/108* (2006.01)
(52) U.S. Cl. ............................. 257/301; 257/E27.092
(58) Field of Classification Search ................ 257/301, 257/306, 296, 386, E27.092, 68, 307
See application file for complete search history.

(56) References Cited

U.S. PATENT DOCUMENTS

| | | | | |
|---|---|---|---|---|
| 6,319,824 B1* | 11/2001 | Lee et al. | ..................... | 438/639 |
| 6,541,335 B2* | 4/2003 | Iwasa | ..................... | 438/243 |
| 6,627,939 B2* | 9/2003 | Yamaguchi | .................. | 257/301 |
| 6,815,771 B2 | 11/2004 | Kimura et al. | | |
| 6,869,877 B2* | 3/2005 | Rhodes et al. | .............. | 438/686 |
| 2006/0163639 A1* | 7/2006 | Ogawa | ....................... | 257/306 |

FOREIGN PATENT DOCUMENTS

| | | |
|---|---|---|
| JP | 01-274028 | 11/1989 |
| KR | 1020040086701 | 10/2004 |

* cited by examiner

*Primary Examiner*—Sue Purvis
*Assistant Examiner*—Selim Ahmed
(74) *Attorney, Agent, or Firm*—Myers Bigel Sibley & Sajovec

(57) ABSTRACT

A semiconductor integrated circuit device includes a first interlayer insulation film having a contact therein. The contact has an upper surface and including a void therein having an open upper portion. The device further includes a plasma damage reduction unit including a lower electrode conformably on the void of the contact and on the upper surface of the contact, a dielectric film on the lower electrode, and an upper electrode on the dielectric film. The thickness of the portion of the dielectric film in the void is smaller than the thickness of the portion of the dielectric film on the upper surface of the contact.

12 Claims, 7 Drawing Sheets

SEMICONDUCTOR INTEGRATED CIRCUIT DEVICES

CROSS-REFERENCE TO RELATED APPLICATION

This application is based on and claims priority from Korean Patent Application No. 10-2005-0106710 filed on Nov. 8, 2005, and Korean Patent Application No. 10-2005-0109276 filed on Nov. 15, 2005, in the Korean Intellectual Property Office, the disclosures of which are incorporated herein in their entirety by reference.

FIELD OF THE INVENTION

The present invention relates to a semiconductor integrated circuit devices and methods of forming the same and, more particularly, to semiconductor integrated circuit devices having improved electrical characteristics and methods of forming the same.

BACKGROUND

With the decrease in the size of semiconductor devices, the cross-sectional area of cells in semiconductor devices has also drastically decreased. As such, it is increasingly difficult, for example, to implement capacitors for devices such as Dynamic Random Access Memory devices (DRAMs). In order to increase the capacitance of DRAM capacitors, it may be possible to use a high dielectric material, to reduce the thickness of dielectric films, and/or to increase the effective area of lower electrodes of the capacitors. Making dielectric films thinner may make the films more susceptible to damage from electric charges.

In order to form a capacitor, a lower electrode, a dielectric film, and an upper electrode may typically be deposited on a substrate, specified regions may be etched, and then an interlayer insulation film may be formed on the upper part of the capacitor. To deposit the upper electrode and the interlayer insulation film, a chemical vapor deposition (CVD) method using plasma may be used, while a dry etching procedure using a plasma may be used to etch the upper electrode and the interlayer insulation film.

However, a process using plasma as described above may cause unnecessary damage to the underlying layer of a film being deposited or etched. For example, the dielectric film may be charged with electric charges generated by the plasma. Such electric charges may break and/or damage the dielectric film, which may result in a deterioration of the electrical characteristics of the device.

SUMMARY

A semiconductor integrated circuit device according to some embodiments of the invention includes a first interlayer insulation film having a contact therein. The contact has an upper surface and including a void therein having an open upper portion. The device further includes a plasma damage reduction unit including a lower electrode conformably on the void of the contact and on the upper surface of the contact, a dielectric film on the lower electrode, and an upper electrode on the dielectric film. A thickness of a portion of the dielectric film in the void may be smaller than a thickness of a portion of the dielectric film on the upper surface of the contact.

The semiconductor integrated circuit device may further include a second interlayer insulation film having an opening exposing an upper portion of the contact, and the lower electrode may be conformably on a sidewall of the second interlayer insulation film. The thickness of the portion of the dielectric film in the void may be smaller than a thickness of a portion of the dielectric film on the sidewall of the second interlayer insulation film.

A semiconductor integrated circuit device according to further embodiments of the invention includes a first interlayer insulation film including therein a first contact and a second contact including a void of which an upper portion may be open, a capacitor including a first lower electrode on the first interlayer insulation film and electrically connected to the first contact, a first dielectric film on the first lower electrode, and a first upper electrode on the first dielectric film. The device further includes a plasma damage reduction unit having a second lower electrode conformably on the void of the second contact and an upper surface of the second contact, a second dielectric film on the second lower electrode, and a second upper electrode on the second dielectric film. A thickness of a portion of the second dielectric film on the void may be smaller than a thickness of a portion of the second dielectric film on the upper surface of the second contact.

The semiconductor integrated circuit device may further include a second interlayer insulation film on the first interlayer insulation film. The second interlayer insulation film may have a first opening exposing the first contact and a second opening exposing the second contact. The first lower electrode may be conformably on the first opening, the second lower electrode may be conformably on the void of the second contact and the second opening, and the thickness of the portion of the second dielectric film on the void may be smaller than a thickness of a portion of the second dielectric film on a sidewall of the second opening. The second contact may have a width greater than that of the first contact.

The first and second dielectric films may be connected together and the first and second upper electrodes may be connected together. In other embodiments, the first and second dielectric films may be separated from one another, and the first and second upper electrodes may be separated from one another.

Some embodiments of the invention provide methods of forming a semiconductor integrated circuit device. The methods may include forming a first interlayer insulation film having a contact therein, the contact having an upper surface and a void of which an upper portion may be open, conformably forming a lower electrode on the void of the contact and on an upper surface of the contact, forming a dielectric film on the lower electrode, and forming an upper electrode on the dielectric film so as to form a plasma damage reduction unit. A thickness of a portion of the dielectric film formed on the void may be smaller than a thickness of a portion of the dielectric film formed on the upper surface of the contact.

The methods may further include forming a second interlayer insulation film on the first interlayer insulation film. The second interlayer insulation film includes an opening exposing an upper portion of the contact. The lower electrode may be conformably formed on the void of the contact and on the opening, and the thickness of the portion of the dielectric film formed on the void may be smaller than a thickness of a portion of the dielectric film formed on the opening.

Methods of forming a semiconductor integrated circuit device according to further embodiments of the invention include forming a first interlayer insulation film on a semiconductor substrate, and forming a first contact and a second contact in the first interlayer insulation film. The second contact has an upper surface and a void of which an upper portion may be open. The methods further include conformably forming a first lower electrode on the first contact and a second lower electrode on the second contact, the first lower electrode being electrically connected to the first contact, and the second lower electrode being connected to the void of the second contact, and forming first and second dielectric films and first and second upper electrodes on the first and second lower electrodes, respectively, to form a capacitor on an upper part of the first contact and a plasma damage reduction unit on the void of the second contact. A thickness of a portion of the second dielectric film formed on the void of the second contact may be smaller than a thickness of a portion of the second dielectric film formed on the upper surface of the second contact.

The methods may further include forming a second interlayer insulation film on the first interlayer insulation film, the second interlayer insulation film having a first opening exposing an upper portion of the first contact and a second opening exposing the second contact. The first lower electrode may be conformably formed on the first opening, and the second lower electrode may be conformably formed on the void of the second contact and the second opening. The thickness of the portion of the second dielectric film formed on the void may be smaller than a thickness of a portion of the second dielectric film formed on the second opening. The second contact may have a width greater than that of the first contact.

The first dielectric film may have the same thickness as the portion of the second dielectric film formed on the second opening.

Forming the first contact and the second contact may include forming first contact hole and a second contact hole on the first interlayer insulation film, depositing a conductive material on the first interlayer insulation film and in the first contact hole and the second contact hole, and removing the conductive material from an upper surface of the first interlayer insulation film. The first contact hole is filled with the conductive material to form the first contact and the second contact hole is conformably deposited with the conductive material to form the second contact including the void.

The methods may further include etching an upper portion of the second contact to widen the void after removing the conductive material from the upper surface of the first interlayer insulation film.

The methods may further include etching an upper portion of the second contact to widen the void after forming the second interlayer insulation film.

Forming the first and second lower electrodes may include conformably depositing a conductive material on the first interlayer insulation film, the second interlayer insulating film, the first contact, and the void of the second contact, and removing the conductive material from an upper surface of the second interlayer insulation film.

The first and second dielectric films may be connected together and the first and second upper electrodes may be connected together, respectively. In alternative embodiments, the methods may further include patterning the first and second dielectric films and the first and second upper electrodes to separate the first and second dielectric films and to separate the first and second upper electrodes.

A semiconductor integrated circuit device according to still further embodiments of the invention includes a first interlayer insulation film including therein a first contact and a second contact including a void of which an upper portion may be open, and a second interlayer insulation film on the first interlayer insulation film. The second interlayer insulation film includes a first opening exposing the first contact and a second opening exposing the second contact. A capacitor including a first lower electrode is on the first interlayer insulation film and is electrically connected to the first contact. A first dielectric film is on the first lower electrode, and a first upper electrode is on the first dielectric film. The device further includes a plasma damage reduction unit having a second lower electrode conformably on the void of the second contact and a sidewall of the second opening, a second dielectric film on the second lower electrode, and a second upper electrode on the second dielectric film. The first lower electrode may be conformably on the first opening, and the second lower electrode may be conformably on the void of the second contact and the second opening. A thickness of a portion of the second dielectric film on the void may be smaller than a thickness of a portion of the second dielectric film on the sidewall of the second opening.

A semiconductor integrated circuit device according to still further embodiments of the invention includes a substrate, a capacitor having a first lower electrode electrically coupled to the substrate, a first insulation film on the first electrode, and a first upper electrode on the insulation film. The device further includes a plasma damage reduction unit spaced apart from the capacitor on the substrate. The plasma damage reduction unit includes a second lower electrode electrically coupled to the substrate, and a second insulation film on the second lower electrode. A thickness of a portion of the second insulation film adjacent the substrate is smaller than a thickness of the first insulation film.

The plasma damage reduction unit may be disposed outside an active area of the semiconductor integrated circuit device. The first and second dielectric films may be connected together. In alternative embodiments, the first and second dielectric films may be separated from one another.

Methods of forming a semiconductor integrated circuit device according to still further embodiments of the invention include forming a capacitor on a semiconductor substrate, the capacitor having a first lower electrode electrically coupled to the substrate, a first insulation film on the first electrode, and a first upper electrode on the insulation film. A plasma damage reduction unit is formed spaced apart from the capacitor on the substrate. The plasma damage reduction unit includes a second lower electrode electrically coupled to the substrate, and a second insulation film on the second lower electrode and connected to the first insulation film. A thickness of a portion of the second insulation film adjacent the substrate is smaller than a thickness of the first insulation film. The methods further include generating a plasma above the semiconductor substrate, and discharging electric charges that accumulate on the first insulation film to the substrate through the second insulation film of the plasma damage reduction unit and the second lower electrode of the plasma damage reduction unit. The methods may further include separating the first insulation film and the second insulation film.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 1:
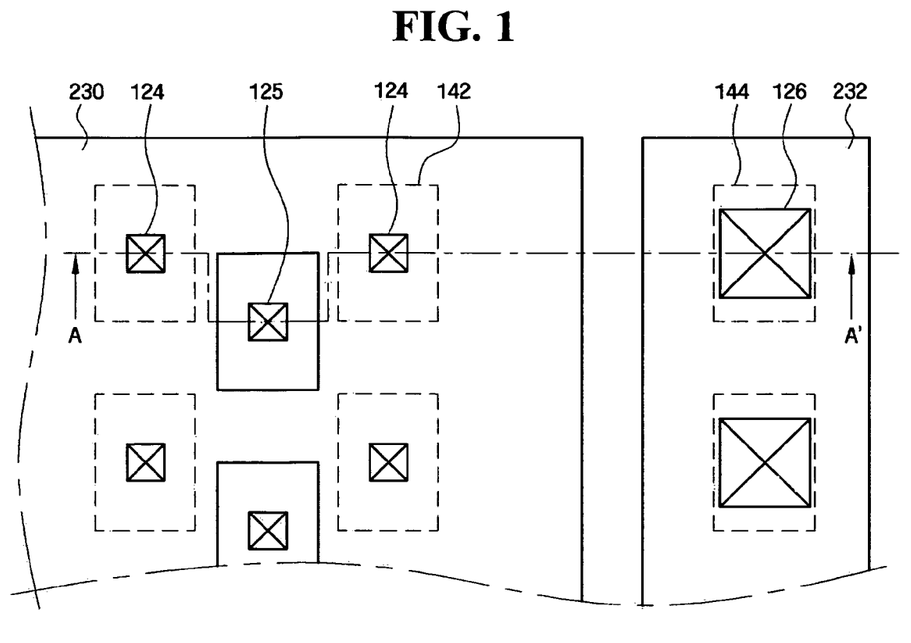
FIG. 1 is a plan view illustrating a layout of a semiconductor integrated circuit device according to some embodiments of the present invention.

A semiconductor integrated circuit device according to some embodiments of the present invention will now be described in detail with reference to FIGS. 1 and 2. FIG. 1 is a plan view illustrating a layout of a semiconductor integrated circuit device according to some embodiments of the present invention, and FIG. 2 is a cross-sectional view taken along line A-A' in FIG. 1.

Figure 2:
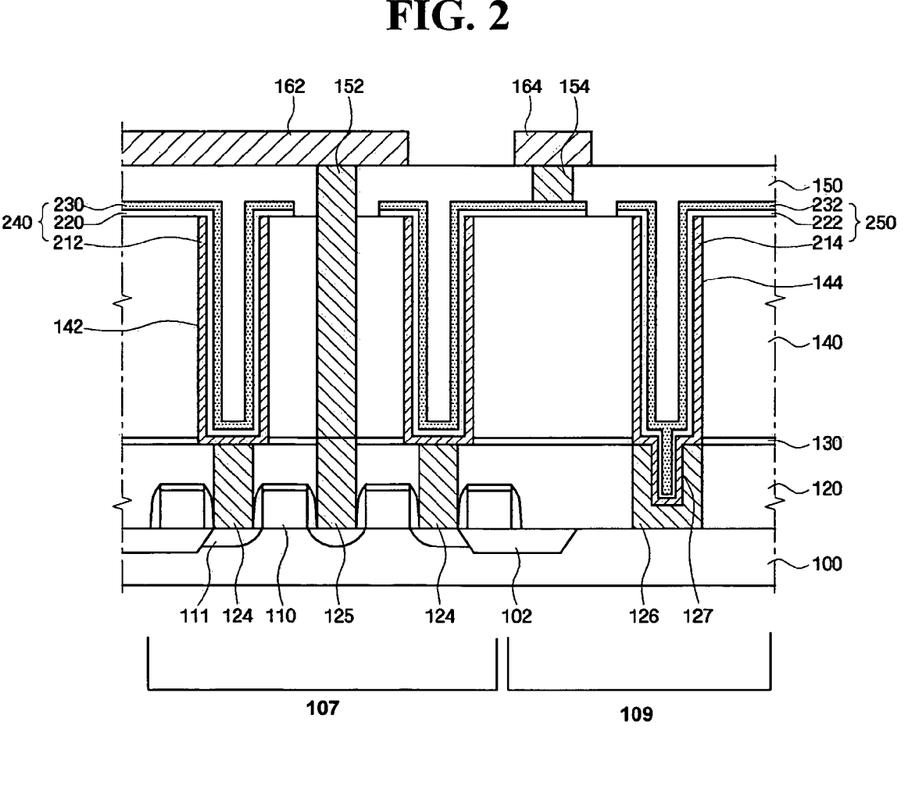
FIG. 2 is a cross-sectional view taken along line A-A' in FIG. 1.

Referring to FIGS. 1 and 2, an isolation film 102 is formed on a semiconductor substrate 100 to divide the substrate into an active region 107 and a field region 109, and a plurality of gate electrodes 110 are positioned on the semiconductor substrate 100. Also, a source/drain region 111 is disposed in alignment with the gate electrode 110 on the semiconductor substrate 100.

The semiconductor substrate 100 may include, for example, a silicon substrate, a silicon-on-insulator (SOI) substrate, a GaAs substrate, a silicon germanium substrate, a ceramic substrate, a quartz substrate, and/or a glass substrate for a display.

A first interlayer insulation film 120 is formed on the semiconductor substrate 100 and the gate electrodes 110. The first interlayer insulation film 120 may be made, for example, of silicon oxide ($SiO_2$).

A first contact 124 is formed in the first interlayer insulation film 120 on the source/drain region 111. The first contact 124 electrically connects the source/drain region 111 of the semiconductor substrate 100 to a first lower electrode 212 of a capacitor 240. Also, a first bit line contact 125 is formed in the first interlayer insulation film 120, and is electrically connected to another source/drain region 111 in the semiconductor substrate 100. The first contact 124 and the first bit line contact 125 are formed using a conductive material. For example, the conductive material may be tungsten (W).

A second contact 126 is formed in the first interlayer insulation film 120 flush with the first contact 124. The second contact 126 connects a plasma damage reduction unit 250 formed thereon with the semiconductor substrate 100. The second contact 126 has a void 127 formed therein. The void 127 is provided with an open upper portion, as shown in FIG. 2.

An etching stop film 130 is formed on the first interlayer insulation film 120, and a second interlayer insulation film 140 is formed on the etching stop film 130. The second-interlayer insulation film 140 may be made, for example, of silicon oxide (SiO2), while the etching stop film 130 may be made, for example, of SiON and/or SiN.

The second interlayer insulation film 140 has first and second openings 142 and 144. The first opening 142 is formed on the first contact 124 and the second opening 144 is open to the second contact 126. The first opening 142 may be wider than the first contact 124. Also, a second bit line contact 152 is formed on the first bit line contact 125.

The capacitor 240 is formed on the first contact 124. The capacitor 240 includes the first lower electrode 212, the first dielectric film 220, and a first upper electrode 230. In FIG. 1 the capacitor 240 is shown as having a concave shape. The concave shape of the capacitor 240 increases the effective area of the first lower electrode 212, so that the capacitor 240 may have a larger capacitance than, for example, a planar capacitor occupying the same surface area of the substrate 100.

The first lower electrode 212 is conformably formed on the first opening 142. The first lower electrode 212 may be made of Ru, Rh, Os, Pd, Pt, W, Mo, Ti, Ta, Al, Cu, Hf, Zr, WN, MoN, TiN, TaN, AlN, HfN, ZrN, and/or TaSiN, and/or a composite thereof.

The first dielectric film 220 is formed along the profile of the first lower electrode 212 on the first lower electrode 212. The first dielectric film 220 may also be formed on the second interlayer insulation film 140. The first dielectric film 220 may be a single film made of $SiN$, $SiO_2$, $Ta_2O_5$, $Al_2O_3$, $HfO_2$, $La_2O_3$, $PrO_2$, and/or $ZnO_2$, or the like. Alternatively or in addition, the first dielectric film 220 may be a composite film including $TiO_2/Ta_2O_5$, $Al_2O_3/TiO_2$, and/or $Al_2O_3/HfO_2$. Also, the first dielectric film 220 may include a high dielectric film, such as BST, PZT, PLZT, and/or $BaTiO_3$.

A first upper electrode 230 is formed along the profile of the first dielectric film 220 on the first dielectric film 220. The first upper electrode 230 may include a single film, a composite film, and/or a doped poly-crystalline silicon film. Also, the first upper electrode 230 may be made of Ru, Rh, Os, Pd, Pt, W, Mo, Ti, Ta, Al, Cu, Hf, Zr, WN, MoN, TiN, TaN, AlN, HfN, ZrN, and/or TaSiN, and/or a composite thereof.

A plasma damage reduction unit 250 is formed on the void 127 of the second contact 126 and the second opening 144. The plasma damage reduction unit 250 includes a second lower electrode 214, a second dielectric film 222, and a second upper electrode 232. The plasma damage reduction unit 250 may reduce damage that may occur to the first dielectric film 220 due to plasma used in the process of fabricating the semiconductor integrated circuit device.

The second lower electrode 214 is conformably formed on the void 127 of the second contact 126, the upper surface of the contact 126, and the second opening 144. The second lower electrode 214 may be made of Ru, Rh, Os, Pd, Pt, W, Mo, Ti, Ta, Al, Cu, Hf, Zr, WN, MoN, TiN, TaN, AlN, HfN, ZrN, and/or TaSiN, and/or a composite thereof.

The second dielectric film 222 is formed along the profile of the second lower electrode 214. That is, the second dielectric film 222 is formed on the portion of the second lower electrode 214 formed in the void 127 and the portion of the second lower electrode 214 formed on the sidewalls of the second opening 144. As shown in FIG. 2, the portion of the second dielectric film 222 formed in the void 127 is thinner than the portion of the second dielectric film 222 formed on the upper surface of the contact 126 or on the sidewalls of the second opening 144. As shown in FIG. 2, the portion of the second dielectric film 222 formed on the sidewalls of the second opening 144 may have a thickness equal to that of the first dielectric film 220. The second dielectric film 222 may include a single film made of $SiN$, $SiO_2$, $Ta_2O_5$, $Al_2O_3$, $HfO_2$, $La_2O_3$, $PrO_2$, and/or $ZnO_2$, or the like. Alternatively or in addition, the second dielectric film 222 may include a composite film made of $TiO_2/Ta_2O_5$, $Al_2O_3/TiO_2$, and/or $Al_2O_3/HfO_2$. Also, the second dielectric film 222 may include a high dielectric film, such as BST, PZT, PLZT, and/or $BaTiO_3$.

A second upper electrode 232 is formed on the second dielectric film 222. The second upper electrode 232 may also be conformably formed on the second interlayer insulation film 140. The second upper electrode 232 may include a single film, a composite film, or a doped poly-crystalline silicon film. Also, the second upper electrode 232 may be made of Ru, Rh, Os, Pd, Pt, W, Mo, Ti, Ta, Al, Cu, Hf, Zr, WN, MoN, TiN, TaN, AlN, HfN, ZrN, and/or TaSiN, and/or a composite thereof. As shown in FIG. 2, the second upper electrode 232 may formed to bury the void 127.

In the process of fabricating the semiconductor, electric charges may be generated by the plasma that is used when a film is deposited or etched. The electric charges may charge and/or break the first dielectric film 220 of the capacitor 240, which can damage the semiconductor device. The plasma damage reduction unit 250 may reduce the charging of the first dielectric film 220 with electric charges generated by the plasma in the process of fabricating the semiconductor.

Specifically, since the portion of the second dielectric film 222 formed on the void 127 of the second contact 126 is thinner than the portion of the second dielectric film 222 formed on the sidewalls of the second opening 144, electric charges generated during the process of fabricating the semiconductor that are collected on the thin second dielectric film 222 may leak to the second contact 126 through the second dielectric film 222. Therefore, it may be possible to prevent the first dielectric film 220 from being damaged or broken due to the accumulation of electric charges, which can reduce or prevent the damage of the first dielectric film 220. Consequently, the electric characteristics of the capacitor 240 can be improved. As shown in FIGS. 1 and 2, the first dielectric film 220 may be separated from the second dielectric film 222. However, since the first and second dielectric films 220 and 222 are connected to each other during the process of fabricating the capacitor 240, electric charges that accumulate on the first dielectric film 220 can be discharged via the second dielectric film 222.

Methods of forming a semiconductor integrated circuit device according to some embodiments of the present invention will now be described with reference to FIGS. 3 through 12.

Figure 3:
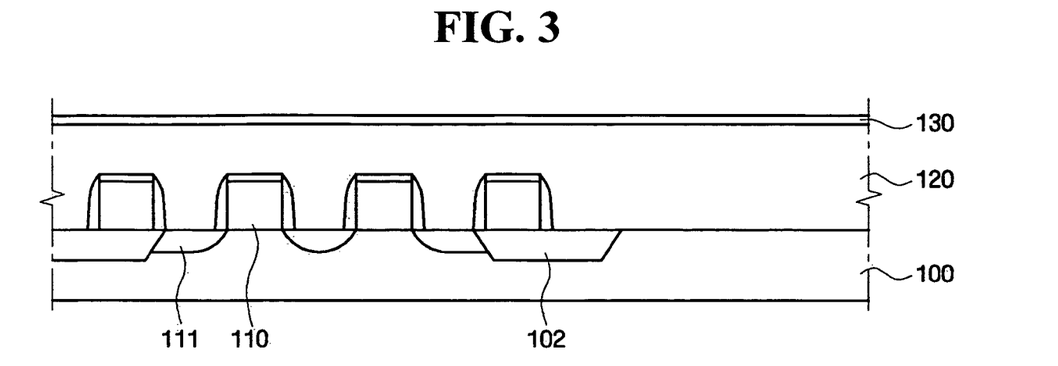
FIGS. 3 through 12 are cross-sectional views illustrating methods of fabricating a semiconductor integrated circuit device according to some embodiments of the present invention.

Referring to FIG. 3, the gate electrodes 110 are formed on the semiconductor substrate 100, which is divided into an active region and a field region by the isolation film 102. Ions are implanted between the gate electrodes 110 on the semiconductor substrate 100 to form the source/drain regions 111. Then, the first interlayer insulation film 120 and the etching stop film 130 are sequentially deposited on the region in which the gate electrode 110 is formed, as well as the surrounding area of the semiconductor substrate 100.

Figure 4:
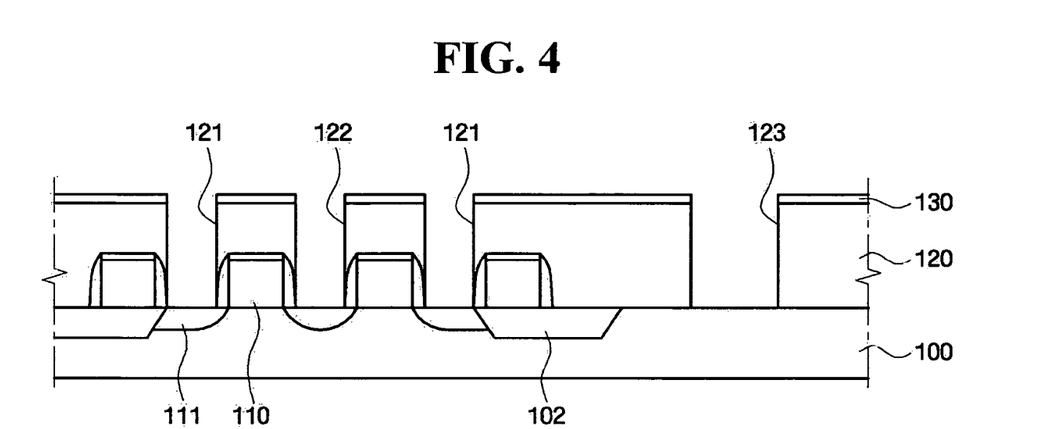

Referring to FIG. 4, the first contact hole 121 and the first bit line contact hole 122, which are electrically connected to the source/drain regions 111 of the semiconductor substrate 100, are formed in the first interlayer insulation film 120 and the etching stop film 130, and the second contact hole 123 is formed in the first interlayer insulating film 120. As shown in FIG. 4, a portion of the first interlayer insulation film 120 and the etching stop film 130 is sequentially etched using an etching mask to expose the semiconductor substrate 100, so that the first and second contact holes 121 and 123, and the first bit line contact hole 122 are formed. As further illustrated in FIG. 4, the second contact hole 123 may be wider than the first contact hole 121. For example, the ratio of the width of the second contact hole 123 to the width of the first contact hole 121 may be about 2:1.

Figure 5:
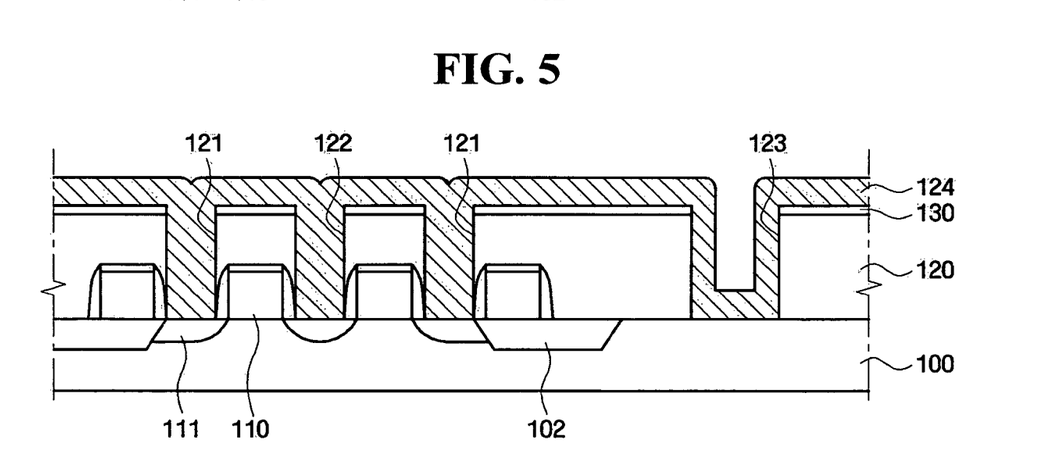

Referring to FIG. 5, a conductive material 124' is deposited on the first interlayer insulation film 120. As shown in FIG. 5, the conductive material 124 fills the first contact hole 121 and the first bit line contact hole 122, and is conformably deposited on the second contact hole 123, so that the conductive material 124' is formed with a thickness so as not to completely fill the second contact hole 123.

Figure 6:
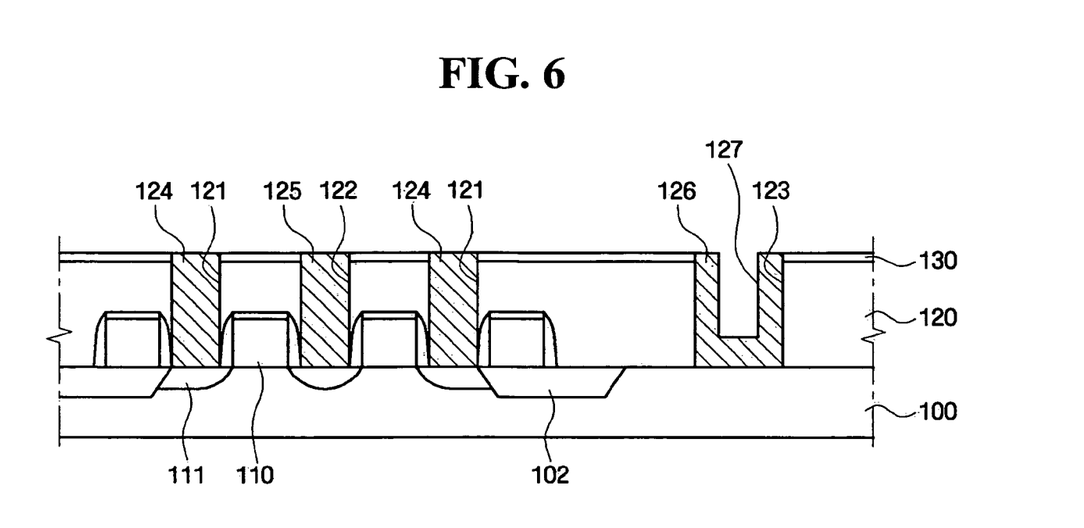

Referring to FIG. 6, the upper portion of the conductive material 124' is subjected to chemical mechanical polishing (CMP) and/or etch-back to the etch stop layer 130 to form the first and second contacts 124 and 126 and the first bit line contact 125. Thus, the first contact hole 121 and the first bit line contact hole 122 are filled with the conductive material 124' to complete the first contact 124 and the first bit line contact 125. The conductive material 124' is conformably deposited on the second contact hole 123 to complete the second contact 126 having an upper surface 126A and a void 127 with an open upper portion.

In some embodiments, an etching process may be carried out to increase the size of the void 127 of the second contact 126.

Figure 7:
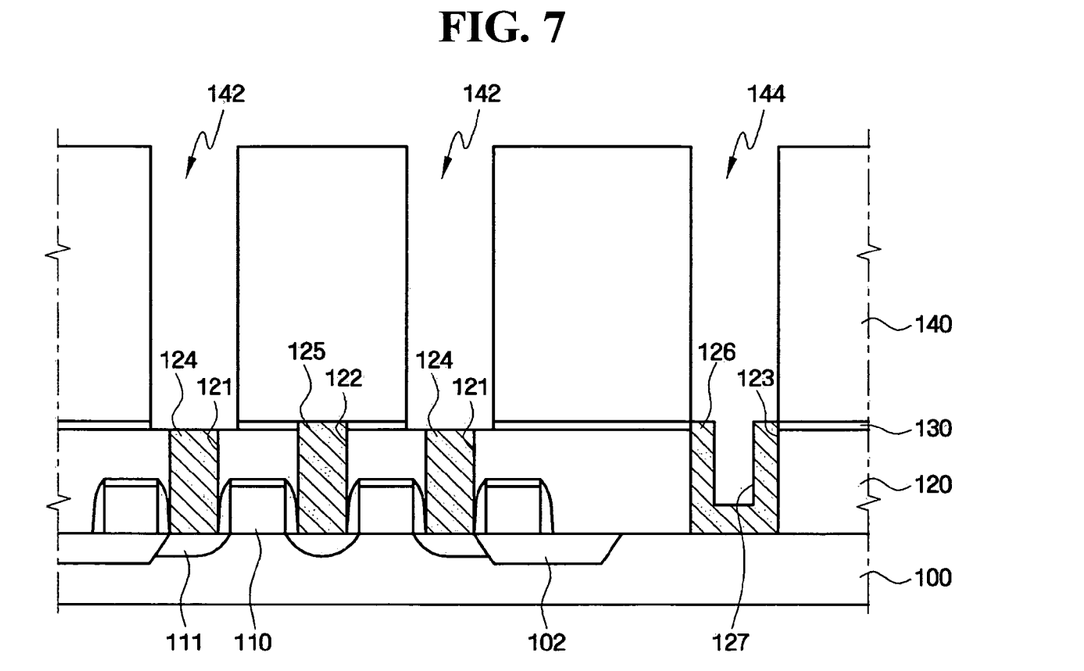

Next, referring to FIG. 7, the second interlayer insulation film 140 having the openings 142 and 144 is formed on the first interlayer insulation film 120. As shown in FIG. 7, the first opening 142 is formed above the first contact 124, while the second opening 144 is formed above the second contact 126 so that the void 127 is exposed. The first opening 142 may have a width that is greater than the width of the first contact 124, and the second opening 144 may have a width greater than the width of the void 127 of the second contact 126 so that the upper surface 126A of the second contact 126 is exposed.

Since the second opening 144 is formed to expose the void 127 of the second contact 127, an etching process may be carried out to increase the size of the void 127 of the second contact 126 after formation and patterning of the second interlayer insulation film 140.

Figure 8:
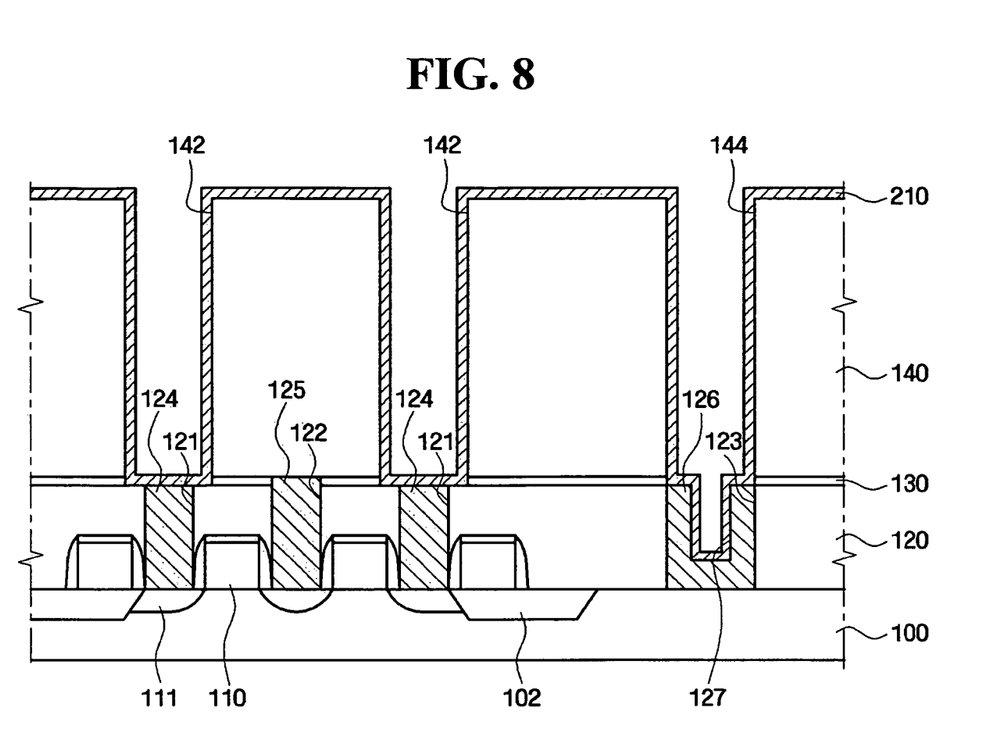

Referring to FIG. 8, a conductive film 210 for the lower electrodes 220, 222 is deposited on the second interlayer insulation film 140. The conductive film 210 may conform to the first and second openings 142 and 144 and to the void 127 of the second contact 126. The conductive film 210 for the lower electrodes 220, 222 may be formed, for example, by metal organic chemical vapor deposition (MOCVD). As shown in FIG. 8, the conductive film 210 for the lower electrodes formed on the second interlayer insulation film 140, the first and second openings 142 and 144, and the void 127 of the second contact 126 may have a uniform thickness.

Figure 9:
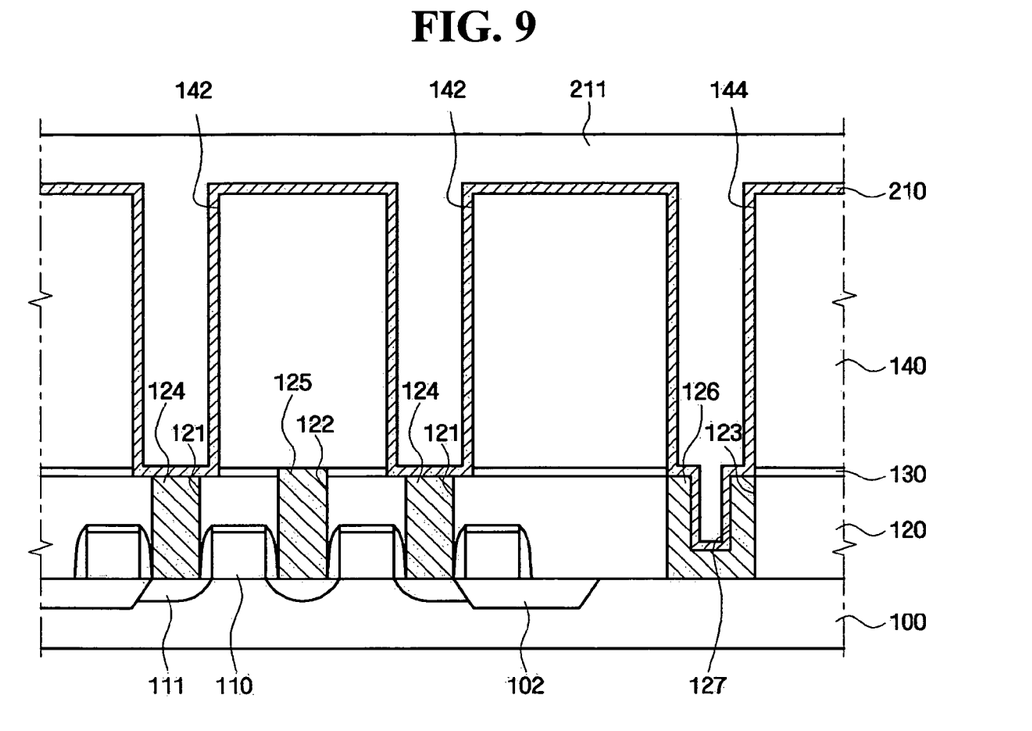

Referring to FIG. 9, a sacrificial film 211 is formed to fill the inside of the conductive film 210. The sacrificial film 211 may be formed to facilitate a planarization process for separating the first and second lower electrodes from one another. The sacrificial film 211 may include an insulation film, such as silicon oxide, or a photosensitive film. If the conductive film 210 is filled with the sacrificial film 211, the first and second openings 142 and 144 are filled with the sacrificial film 211. As the void 127 exposed by the second opening 144 is narrow, and the step coverage of the sacrificial film 211 may be poor, the sacrificial film 211 may not fill the second opening 144. That is, when the conductive film 210 for the lower electrode is filled with the sacrificial film 211, the void 127 may be left empty.

Figure 10:
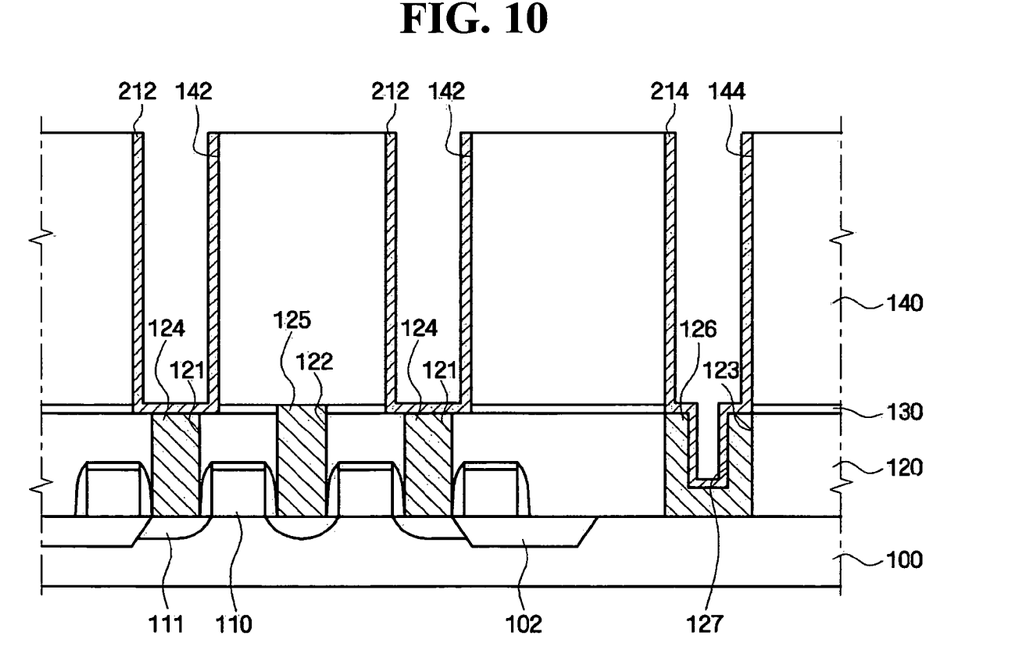

Next, referring to FIG. 10, the first and second lower electrodes 212 and 214 are formed. First, the sacrificial film 211 is subjected to CMP and/or etch-back until the second interlayer insulation film 140 is exposed. Then, the first and second lower electrodes 212 and 214 are separated, with the space between the first and second lower electrodes 212 and 214 being filled with the sacrificial film (see reference numeral 211 in FIG. 8). Once the sacrificial film is etched and removed, the first and second lower electrodes 212 and 214 are formed, as shown in FIG. 10. The first lower electrode 212 is conformably formed in the first opening 142, and the second lower electrode 214 is conformably formed in the second opening 144 and the void 127 of the second contact 126.

Figure 11:
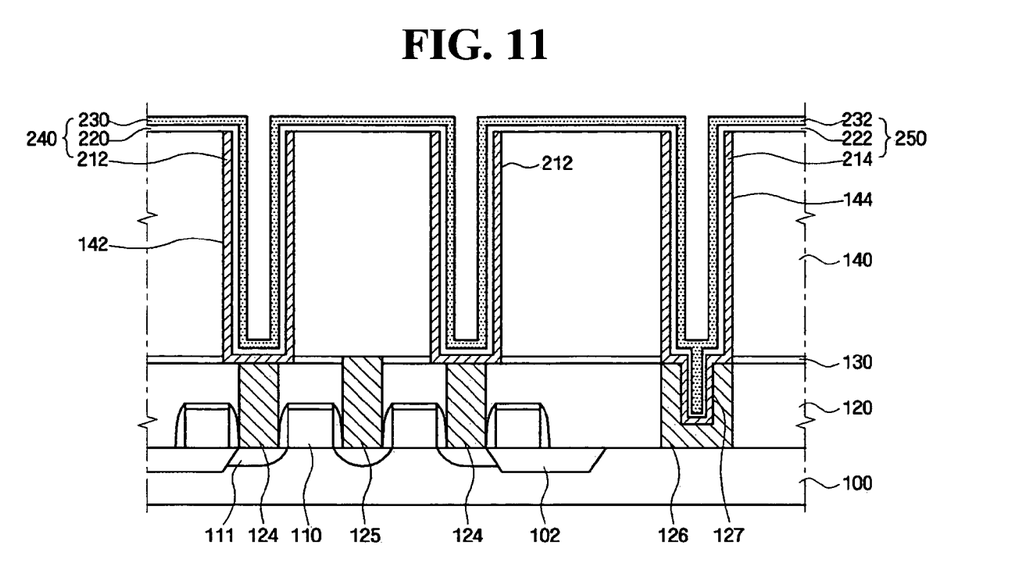

Referring to FIG. 11, the first and second dielectric films 220 and 222 and the first and second upper electrodes 230 and 232 are formed on the first and second lower electrodes 212 and 214, respectively. That is, the first dielectric film 220 and the first upper electrode 230 are formed on the first lower electrode 212 to complete the capacitor 240 on the first contact 124, and the second dielectric film 222 and the second upper electrode 232 are formed on the second lower electrode 214 to complete the plasma damage reduction unit 250 on the void 127 of the second contact 126.

Initially, the first and second dielectric films 220 and 222 are deposited on the first and second lower electrodes 212 and 214 and the second interlayer insulation film 140. As shown in FIG. 11, the first and second dielectric films 220 and 222 are deposited along the profile of the first and second lower electrodes 212 and 214 and the second interlayer insulation film 140. The first and second dielectric films 220 and 222 may be formed, for example, by chemical vapor deposition (CVD). In order to improve the electric characteristics of the first and second dielectric films 220 and 222, the first and second dielectric films 220 and 222 may be subjected to an ozonization and/or plasma process under atmosphere containing oxygen or nitrogen. Furthermore, the portion of the second dielectric film 222 formed on the void 127 of the second contact 126 is smaller than the portion of the second dielectric film 222 formed on the upper surface of the contact 127 and/or the second opening 144.

Then, the first and second upper electrodes 230 and 232 are deposited on the first and second dielectric films 220, 222. The first and second upper electrodes 230 and 232 may be formed by physical vapor deposition (PVD), CVD, and/or atomic layer deposition (ALD). Also, the first and second upper electrodes 230 and 232 may be supplied with oxygen, and/or may be additionally subjected to a curing process; As shown in FIG. 11, the second upper electrode 232 is formed on the void 127 of the second contact 126 and the second opening 144. The second upper electrode 232 may be formed to fill the void 127 of the second contact 126.

When the first and second upper electrodes 230 and 232 are formed by a PVD, CVD, and/or ALD process, plasma is generated. Electric charges generated by the plasma may accumulate on the first and second dielectric films 220 and 222 through the first and second upper electrodes 230 and 232. In this case, since the portion of the second dielectric film 222 formed on the void 127 of the second contact 126 is thinner than the portion of the second dielectric film 222 formed on the upper surface of the second contact 126 and/or the sidewalls of the second opening 144, the electric charges collected on the second dielectric film 222 may leak to the substrate 100 through the second contact 126. Therefore, damage to the first dielectric film 220 due to the electric charges generated by plasma may be reduced and/or prevented, and/or deterioration of the electric characteristics of the capacitor 240 can be prevented. Accordingly, the capacitor 240 of the semiconductor integrated circuit device may have improved electric characteristics.

Figure 12:
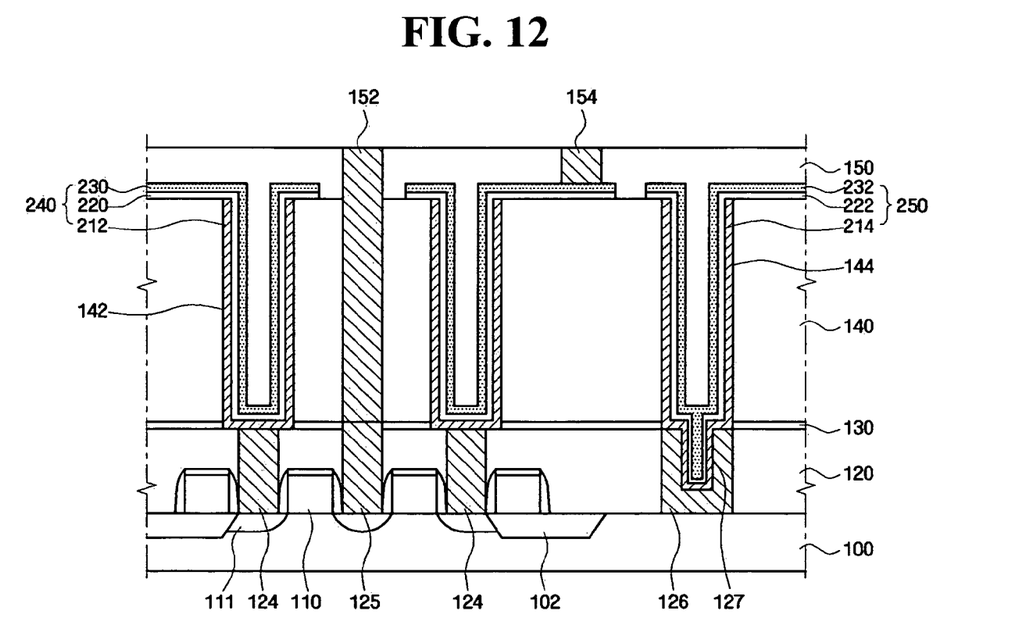

Referring to FIG. 12, the second bit line contact 152 and a wiring contact 154 are formed. First, a portion of the second interlayer insulation layer 140 is etched to expose the upper portion of the first bit line contact 125. As shown in FIG. 12, the portion of the first dielectric film 220 connecting the capacitor 240 with the plasma damage reduction unit 250 may be also etched to separate the capacitor 240 from the plasma damage reduction unit 250.

After the upper portion of the first bit line contact 125 is exposed, a third interlayer insulation film 150 may be formed on the capacitor 240 and the plasma damage reduction unit 250. The third interlayer insulation film 142 may include $O_3$ TESO, SOG and/or TOSZ, and/or may be formed using SA (sub-atmospheric)-CVD.

If a portion of the capacitor 240 is etched through wet etching using a plasma, electric charges may be generated by the plasma. Consequently, the first and second dielectric films 220 and 222 may become charged with electric charges through the first and second upper electrodes 230 and 232. In this case, the electric charges are collected onto the second dielectric film 222 formed on the void 127 of the second contact 126 and having a relatively small thickness. The electric charges that are accumulated on the second dielectric film 222 formed on the void 127 of the second contact 126 may leak to the substrate 100 through the second contact 126. Thus, damage to the first dielectric film 220 due to electric charges can be reduced. Consequently, the capacitor 240 of the semiconductor integrated circuit device may have improved electric characteristics.

After the third interlayer insulation film 150 is formed, the third interlayer insulation film 150 may be partially etched using an etching mask, such as a photoresist pattern, to form a first bit line contact hole and a wiring contact hole. As shown in FIG. 12, the second bit line contact hole is connected to the first bit line contact hole (see reference numeral 122 of FIG. 4) formed under the second bit line contact hole, and the wiring contact hole is connected to the first upper electrode 230 of the capacitor 240. Then, a metal material may be deposited in the second bit line contact hole and the wiring contact hole to complete the second bit line contact 125 and the wiring contact 154. The second bit line contact 152 and the wiring contact 154 may be formed by depositing metal material. In that case, a barrier metal film may be deposited before the metal material of the contacts is deposited. The barrier metal film may include TiN and/or Ti+TiN, so as to increase the adhesiveness of the contact and/or prevent the diffusion of the metal material. The metal material may include W, Ti, TiN, and/or a composite thereof.

Referring to again FIG. 2, a bit line 162 and a wire 164 may be formed on the second bit line contact 152 and the wiring contact 154, respectively. Specifically, after the second bit line contact 152 and the wiring contact 154 are subjected to a planarization process, a metal for forming the bit line 162 and the wire 164 is deposited thereon, and the metal is patterned to form the bit line 162 and the wire 164. The bit line 162 and the wire 164 may include, for example, Cu and/or Al.

Figure 13:
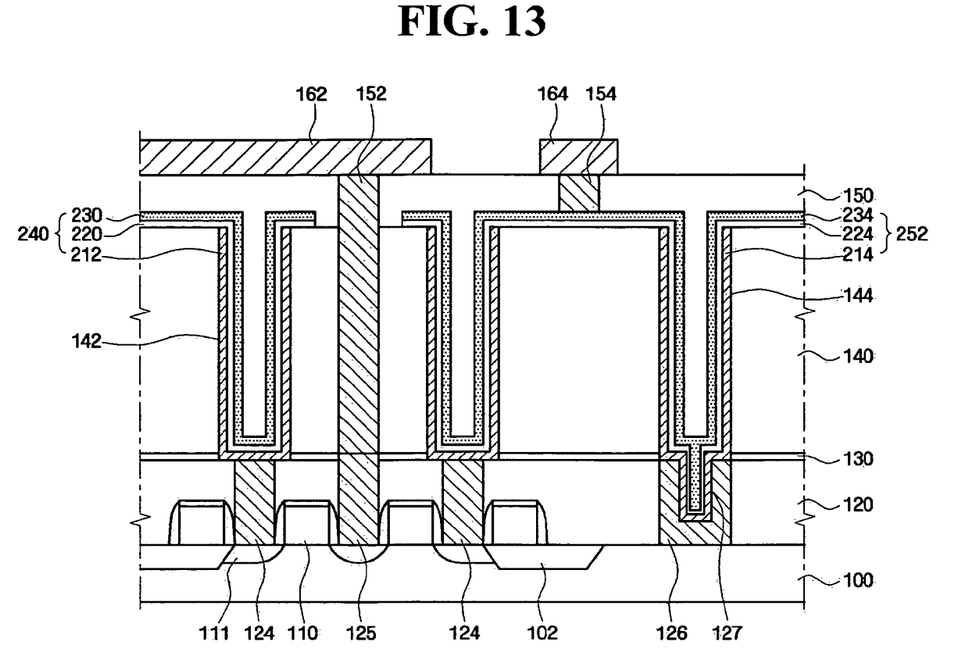
FIG. 13 is a cross-sectional view of a semiconductor integrated circuit device according to further embodiments of the present invention.

A semiconductor integrated circuit device according to further embodiments of the present invention will be now described with reference to FIG. 13. FIG. 13 is a cross-sectional view of a semiconductor integrated circuit device according to further embodiments of the present invention. Elements of the device illustrated in FIG. 13 that are the same as elements shown in FIG. 2 are indicated by the same reference numerals, and a detailed description thereof will not be repeated for brevity.

The difference between the semiconductor integrated circuit device embodiments shown in FIG. 2 and the embodiments of FIG. 13 is that in the embodiments of FIG. 13, the first dielectric film 220 and the first upper electrode 230 of the capacitor 240 are connected to the second dielectric film 224 and the second upper electrode 234 of the plasma damage reduction unit 252, respectively.

After the capacitor 240 and the plasma damage reduction unit 252 are formed, when a portion of the capacitor 240 is etched to form the second bit line contact 152, if the portion connecting the capacitor 240 with the plasma damage reduction unit 252 is not etched, the capacitor 240 may be connected to the plasma damage reduction unit 252 as shown in FIG. 13.

If the capacitor 240 is connected to the plasma damage reduction unit 252, the capacitor 240 may be protected against electric charges that are generated by the plasma used in subsequent processes, as well as processes associated with forming the capacitor 240 and the plasma damage reduction unit 252. That is, it is possible to prevent the electric characteristics of the capacitor 240 from deteriorating throughout the whole process of fabricating the semiconductor device. Accordingly, methods according to embodiments of the invention can be used to fabricate a semiconductor integrated circuit device having a capacitor 240 with improved electric characteristics.

A semiconductor integrated circuit device according to still further embodiments of the present invention will be now described with reference to FIG. 14, which is a cross-sectional view of a semiconductor integrated circuit device according to still further embodiments of the present invention. The elements illustrated in FIG. 14 that are the same as those shown in FIG. 2 are indicated by the same reference numerals, and a detailed description thereof will not be repeated for brevity.

Figure 14:
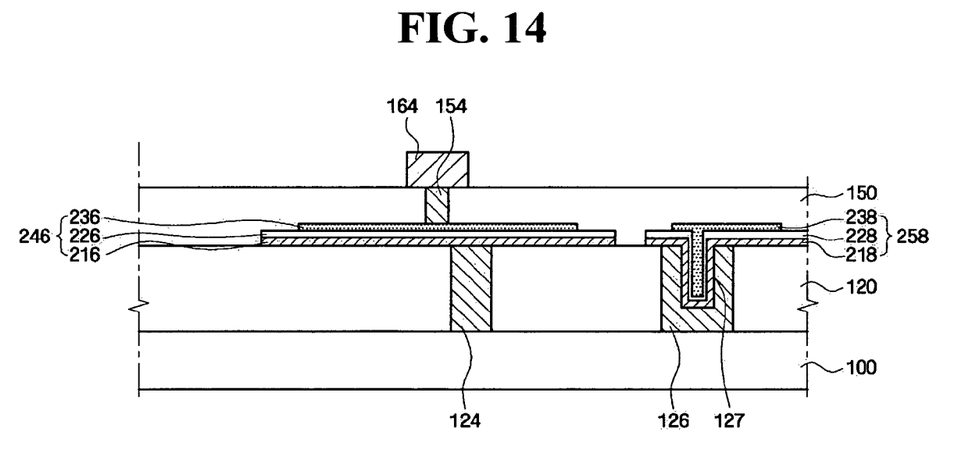
FIG. 14 is a cross-sectional view of a semiconductor integrated circuit device according to still further embodiments of the present invention.

The difference between the embodiments shown in FIG. 2 and those of FIG. 14 is that in the embodiments of FIG. 14, a capacitor 246 having a flat (planar) shape is formed.

Referring to FIG. 14, the flat capacitor 246 includes a first lower electrode 216 and a first dielectric film 226, which are formed on the first contact 124. The capacitor 246 also includes a first upper electrode 236 formed on a portion of the first dielectric film 226. The first upper electrode 236 is connected to the wiring contact 154, so that the wire 164 is connected to the first upper electrode 236.

A plasma damage reduction unit 258 includes a second lower electrode 218 conformably formed on the void 127 of the second contact 126, and a second dielectric film 228 and second upper electrode 238 formed on the second lower electrode 218. The portion of the second dielectric film 228 formed on the void 127 of the second contact 126 is thinner than the portion of the second dielectric film 228 formed on the sidewalls of the first interlayer insulation film 120.

The plasma damage reduction unit 258 can reduce damage to the flat capacitor 246 due to electric charges generated by a plasma used in the process of fabricating the semiconductor device. That is, the plasma damage reduction unit 258 may protect the capacitor 246 against damage due to plasma when the upper electrode of the capacitor 246 is formed and/or when films are deposited on the upper electrode, irrespective of the shape of the capacitor 246, so that deterioration of the electric characteristics of the capacitor 246 may be reduced and/or prevented. Accordingly, embodiments of the invention can be used to fabricate a semiconductor integrated circuit device having a flat (planar) capacitor 246 with improved electric characteristics.

Accordingly, methods for fabricating semiconductor integrated circuit devices according to some embodiments of the invention may have some potential advantages. For example, potential damage to the dielectric film of a capacitor due to the use of plasma in the process of fabricating the semiconductor device can be reduced. Moreover, since the damage to the dielectric film may be reduced, the electric characteristics of the capacitor can be maintained and/or improved, and thus a semiconductor integrated circuit device having improved electric characteristics can be fabricated.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor integrated circuit device comprising:
a first interlayer insulation film having a contact therein, the contact having an upper surface and including a void therein having an open upper portion;
a plasma damage reduction unit including a lower electrode conformably on the void of the contact and on the upper surface of the contact, a dielectric film on the lower electrode, and an upper electrode on the dielectric film; and
a second interlayer insulation film having an opening exposing an upper portion of the contact;
wherein the lower electrode is conformably on a sidewall of the second interlayer insulation film;
wherein a thickness of a portion of the dielectric film in the void is smaller than a thickness of a portion of the dielectric film on the upper surface of the contact; and
wherein the thickness of the portion of the dielectric film in the void is smaller than a thickness of a portion of the dielectric film on the sidewall of the second interlayer insulation film.

2. A semiconductor integrated circuit device comprising:
a first interlayer insulation film including therein a first contact and a second contact including a void of which an upper portion is open;
a capacitor including a first lower electrode on the first interlayer insulation film and electrically connected to the first contact, a first dielectric film on the first lower electrode, and a first upper electrode on the first dielectric film; and
a plasma damage reduction unit having a second lower electrode conformably on the void of the second contact and an upper surface of the second contact, a second dielectric film on the second lower electrode, and a second upper electrode on the second dielectric film, wherein a thickness of a portion of the second dielectric film on the void is smaller than a thickness of a portion of the second dielectric film on the upper surface of the second contact; and
wherein the first and second dielectric films are separated from one another, and wherein the first and second upper electrodes are separated from one another.

3. The semiconductor integrated circuit device of claim 2, further comprising a second interlayer insulation film on the first interlayer insulation film, the second interlayer insulation film having a first opening exposing the first contact and a second opening exposing the second contact;
wherein the first lower electrode is conformably on the first opening, the second lower electrode is conformably on the void of the second contact and the second opening, and the thickness of the portion of the second dielectric film on the void is smaller than a thickness of a portion of the second dielectric film on a sidewall of the second opening.

4. The semiconductor integrated circuit device of claim 2, wherein the second contact has a width greater than that of the first contact.

5. The semiconductor integrated circuit device of claim 2, wherein the first and second dielectric films are connected together and the first and second upper electrodes are connected together.

6. A semiconductor integrated circuit device comprising:
a first interlayer insulation film including therein a first contact and a second contact including a void of which an upper portion is open;
a second interlayer insulation film on the first interlayer insulation film, the second interlayer insulation film having a first opening exposing the first contact and a second opening exposing the second contact;
a capacitor including a first lower electrode on the first interlayer insulation film and electrically connected to the first contact, a first dielectric film on the first lower electrode, and a first upper electrode on the first dielectric film; and
a plasma damage reduction unit having a second lower electrode conformably on the void of the second contact and a sidewall of the second opening, a second dielectric film on the second lower electrode, and a second upper electrode on the second dielectric film, wherein the first lower electrode is conformably on the first opening, the second lower electrode is conformably on the void of the second contact and the second opening, and a thickness of a portion of the second dielectric film on the void is smaller than a thickness of a portion of the second dielectric film on the sidewall of the second opening.

7. The semiconductor integrated circuit device of claim 6, wherein the first and second dielectric films are connected together and the first and second upper electrodes are connected together.

8. The semiconductor integrated circuit device of claim 6, wherein the first and second dielectric films are separated from one another, and wherein the first and second upper electrodes are separated from one another.

9. A semiconductor integrated circuit device comprising:
a substrate;
a capacitor having a first lower electrode electrically coupled to the substrate, a first insulation film on the first electrode, and a first upper electrode on the insulation film; and
a plasma damage reduction unit spaced apart from the capacitor on the substrate, the plasma damage reduction unit including a second lower electrode electrically coupled to the substrate, and a second insulation film on the second lower electrode, wherein a thickness of a portion of the second insulation film adjacent the substrate is smaller than a thickness of the first insulation film.

10. The semiconductor integrated circuit device of claim 9, wherein the plasma damage reduction unit is disposed outside an active area of the semiconductor integrated circuit device.

11. The semiconductor integrated circuit device of claim 9, wherein the first and second dielectric films are connected together.

12. The semiconductor integrated circuit device of claim 9, wherein the first and second dielectric films are separated from one another.

* * * * *